(12) United States Patent
Dasgupta et al.

(10) Patent No.: US 8,395,042 B2
(45) Date of Patent: Mar. 12, 2013

(54) QUANTUM DOT SOLAR CELL WITH QUANTUM DOT BANDGAP GRADIENTS

(75) Inventors: Neil Dasgupta, Menlo Park, CA (US); Friedrich B. Prinz, Woodside, CA (US); Timothy P. Holme, Menlo Park, CA (US); James F Mack, Palo Alto, CA (US)

(73) Assignees: The Board of Trustees of the Leland Stanford Junior University, Palo Alto, CA (US); Honda Motor Co., Ltd, Tokyo (JP)

( * ) Notice: Subject to any disclaimer, the term of this patent is extended or adjusted under 35 U.S.C. 154(b) by 528 days.

(21) Appl. No.: 12/383,584

(22) Filed: Mar. 24, 2009

(65) Prior Publication Data

US 2009/0255580 A1    Oct. 15, 2009

Related U.S. Application Data

(60) Provisional application No. 61/070,690, filed on Mar. 24, 2008.

(51) Int. Cl.
*H01L 31/00* (2006.01)
(52) U.S. Cl. .................................. 136/255
(58) Field of Classification Search ............ 136/249, 136/255, 256; 977/774; 257/440, 441, 461, 257/465, 466
See application file for complete search history.

(56) References Cited

U.S. PATENT DOCUMENTS

| | | | |
|---|---|---|---|
| 5,720,827 A | 2/1998 | Simmons | |
| 6,852,920 B2 | 2/2005 | Sager et al. | |
| 6,878,871 B2 | 4/2005 | Scher et al. | |
| 7,326,955 B2 | 2/2008 | Forrest et al. | |
| 2002/0050288 A1 | 5/2002 | Suzuki | |
| 2004/0126582 A1 | 7/2004 | Ng et al. | |
| 2006/0130893 A1 | 6/2006 | Gregg | |
| 2007/0012355 A1 | 1/2007 | LoCascio et al. | |
| 2007/0137693 A1* | 6/2007 | Forrest | 136/255 |
| 2007/0227588 A1* | 10/2007 | Gossard et al. | 136/255 |
| 2008/0210302 A1* | 9/2008 | Gupta | 136/260 |

FOREIGN PATENT DOCUMENTS

WO    WO 2006/125272    11/2006

OTHER PUBLICATIONS

Samokhvalov et al., "Electronic Properties of Hybrid Organic/Inorganic Langmuir-Blodgett Films Containing CdS Quantum Particles," J. Phys. Chem. B. 2002, 106, 9070-9078.
Mamedov et al., "Nanorainbows: Graded Semiconductor Films from Quantum Dots," J. Am. Chem. Soc. 2001, 123, 7738-7739.
Franzl et al., "Exciton Recycling in Graded Gap Nanocrystal Structures," Nano Letters 2004, vol. 4, No. 9, 1599-1603.
Rogach et al., "Energy Transfer With Semiconductor Nanocrystals," J. Mater. Chem., 2009, 19, 1208-1221.
Weiss et al. "Size-Dependent Charge Collection in Junctions containing Single-Size and Multi-Size Arrays of Colloidal CdSe Quantum Dots," J. Am. Chem. Soc. 2008, 130, 74-82.

* cited by examiner

*Primary Examiner* — Jennifer Michener
*Assistant Examiner* — Eli Mekhlin
(74) *Attorney, Agent, or Firm* — Lumen Patent Firm (57) ABSTRACT

Efficient photovoltaic devices with quantum dots are provided. Quantum dots have numerous desirable properties that can be used in solar cells, including an easily selected bandgap and Fermi level. In particular, the size and composition of a quantum dot can determine its bandgap and Fermi level. By precise deposition of quantum dots in the active layer of a solar cell, bandgap gradients can be present for efficient sunlight absorption, exciton dissociation, and charge transport. Mismatching Fermi levels are also present between adjacent quantum dots, allowing for built-in electric fields to form and aid in charge transport and the prevention of exciton recombination.

20 Claims, 7 Drawing Sheets

QUANTUM DOT SOLAR CELL WITH QUANTUM DOT BANDGAP GRADIENTS

CROSS-REFERENCE TO RELATED APPLICATIONS

This application claims priority from U.S. Provisional Patent Application 61/070,690 filed Mar. 24, 2008, which is incorporated herein by reference.

FIELD OF THE INVENTION

The invention relates generally to photovoltaic cells. More particularly, the present invention relates to quantum dot solar cells (QDSCs).

BACKGROUND

Solar cells and photovoltaic devices convert light, particularly sunlight, into electrical power. More particularly, photovoltaic devices convert incoming photons into charge carriers, such as electrons and holes, which are directed to conductors to perform useful work. Solar cells are currently used for a variety of applications at the personal, industrial, and, more recently, utility levels. Widespread adoption of photovoltaic cells can make significant contributions to solving a variety of national and global issues, including energy use, global climate change, and security.

However, market penetration of solar cells has been limited at least partly due to technological obstacles. Despite active and intensive research on improving photovoltaic technology, current solar cell efficiencies have generally been limited to about 10-15%. Today, the most commonly manufactured photovoltaic devices are silicon solar cells. Efficient silicon solar cells rely on extremely precise and uniform crystal structures of high quality silicon. However, these materials can be costly and have limited availability. In addition, drastic technological improvements of silicon solar cell efficiency are unlikely achievable.

In addition to traditional crystalline silicon solar cells, active research has been directed to thin film solar cells and nanoparticle (or quantum dot) solar cells with the goal of improving efficiency and/or decreasing cost. Unfortunately, these research directions also face many technological obstacles. In particular, existing nanoparticle solar cells face difficulties with photon absorption and exciton recombination, where an exciton is a particle comprised of a bound electron-hole pair. Even when excitons are successfully disassociated and not recombined, existing nanoparticle solar cells have limited efficiencies due to difficulties with charge transport. Furthermore, nanoparticle solar cells are generally fabricated using drop-casting or spin-casting of colloidal particles, or Stransky-Krastinow growth techniques, which do not allow for precise control of nanoparticle properties and positioning in the solar cell.

The present invention addresses at least the difficult problem of efficient photovoltaic devices and advances the art with a novel quantum dot solar cell.

SUMMARY OF THE INVENTION

The present invention is directed to a photovoltaic device having quantum dots and a bandgap gradient. In a preferred embodiment, the photovoltaic device includes a first conductor layer, a second conductor layer, and an active layer situated between the first and second conductor layers, wherein the active layer includes a matrix material and a plurality of quantum dots deposited in the matrix material, wherein each of the quantum dots has a bandgap, wherein the position of each quantum dot is based on the size of its bandgap, wherein the quantum dots having larger bandgaps are positioned closer to the first conductor layer than the quantum dots with smaller bandgaps, thereby a bandgap gradient is present in the active layer. Preferably, a size gradient of the quantum dots is present in the active layer, wherein the bandgap gradient is created by the size gradient. Alternatively or additionally, at least some of the quantum dots have different compositions and the bandgap gradient is created by the different compositions of the quantum dots.

In certain embodiments of the present invention, each of the quantum dots has a Fermi level, wherein at least two adjacent quantum dots have different Fermi levels, and wherein the differences in Fermi levels of the adjacent quantum dots creates a built-in electric field. In a preferred embodiment, quantum dots with higher Fermi levels are positioned closer to the first conductor layer than the quantum dots with lower Fermi levels.

In an embodiment, the photovoltaic device also includes a tunnel junction layer situated between the first and the second conductor layers. In an embodiment, the device includes an n+ layer situated between the first conductor layer and the active layer and a p+ layer situated between the second conductor layer and the active layer, wherein the n+ and p+ layers create an electric field in the active layer.

In an embodiment, at least one of the conductor layers is optically transparent and/or at least one of the conductor layers is optically reflective. In a preferred embodiment, the quantum dots are deposited by atomic layer deposition (ALD), layer-by-layer assembly, Langmuir-Blodgett deposition, or a combination thereof. Preferably, the distance between adjacent quantum dots in the active layer is sufficiently small to allow charge tunneling between adjacent quantum dots. In an embodiment, the distance between adjacent quantum dot ranges from about 0.5 nm to about 10 nm.

The quantum dots in embodiments of the present invention can be metallic quantum dots, semiconducting quantum dots, or any combination thereof. In an embodiment, each of the quantum dots range in size from about 0.5 nm to about 50 nm and have one or more shapes selected from the group consisting of rods, spheres, disks, pyramids, triangles, squares, and tetrapods. In an embodiment the matrix material includes an insulator, a semiconductor, or a combination thereof. In a preferred embodiment, the matrix material conducts a first type of charge carrier and the quantum dots conduct a second type of charge carrier.

Certain embodiments of the present invention are directed to a photovoltaic device including a first conductor layer, a second conductor layer, and a plurality of active layers situated between the first and the second conductor layers. Each of the active layers include a matrix material and a plurality of quantum dots deposited in the matrix material, wherein each of the quantum dots has a bandgap, wherein for each of the active layers, the position of the quantum dots is based on the size of its bandgap, and wherein a bandgap gradient is present in each of the active layers. In a preferred embodiment, the position of each active layer is based on the bandgap of its quantum dots, wherein active layers having quantum dots with larger bandgaps are closer to the first conductor layer than active layers having quantum dots with smaller bandgaps. In a preferred embodiment, the device includes one or more tunnel junction layers situated between two of the active layers. In an embodiment, the matrix materials of at least two of the active layers have different dielectric constants.

BRIEF DESCRIPTION OF THE FIGURES

The present invention together with its objectives and advantages will be understood by reading the following description in conjunction with the drawings, in which.

DETAILED DESCRIPTION OF THE INVENTION

Developing efficient and cost-effective solar cells can be a daunting task, but one with considerable payoffs in terms of global climate change and energy security. Some existing photovoltaic technologies employ nanoparticles or quantum dots in the active photovoltaic material. However, many existing techniques face difficulties with exciton recombination, charge transport, and limited device efficiency. The present invention is directed to a quantum dot solar cell (QDSC) having bandgap gradients for greater efficiency.

In embodiments of the present invention, quantum dots are used in the active photovoltaic material for converting photons into charge carriers, primarily by disassociating excitons (particles comprised of pairs of negatively-charged electrons and positively-charged holes). Quantum dots have many desirable physical properties in photovoltaics, such as a tunable bandgap and Fermi level. A quantum dot's bandgap can be much different than the bulk material due to the small size of the quantum dot. Oftentimes, a material may not be semiconducting (i.e. it has zero bandgap) in the bulk, but when the material is sufficiently small, a finite bandgap forms. In general, the bandgap of a quantum dot is inversely related to the quantum dot size, thereby quantum dots of the present invention can be tuned to have the desired bandgaps. In an embodiment of the present invention, the quantum dots have bandgaps ranging from about 0 eV to about 3 eV, a range that is appropriate for sunlight.

It is important to note that the size of a quantum dot typically also determines its Fermi level. Similar to the bandgap, the location of the Fermi level of a quantum dot is inversely related to the quantum dot size; quantum dots of smaller sizes generally have higher Fermi levels than larger quantum dots of the same composition. As will be described in greater detail below, by having neighboring and proximate quantum dots with different Fermi levels, a built-in voltage can form, thereby reducing likelihood of exciton recombination and contributing to charge transport.

Figure 1:
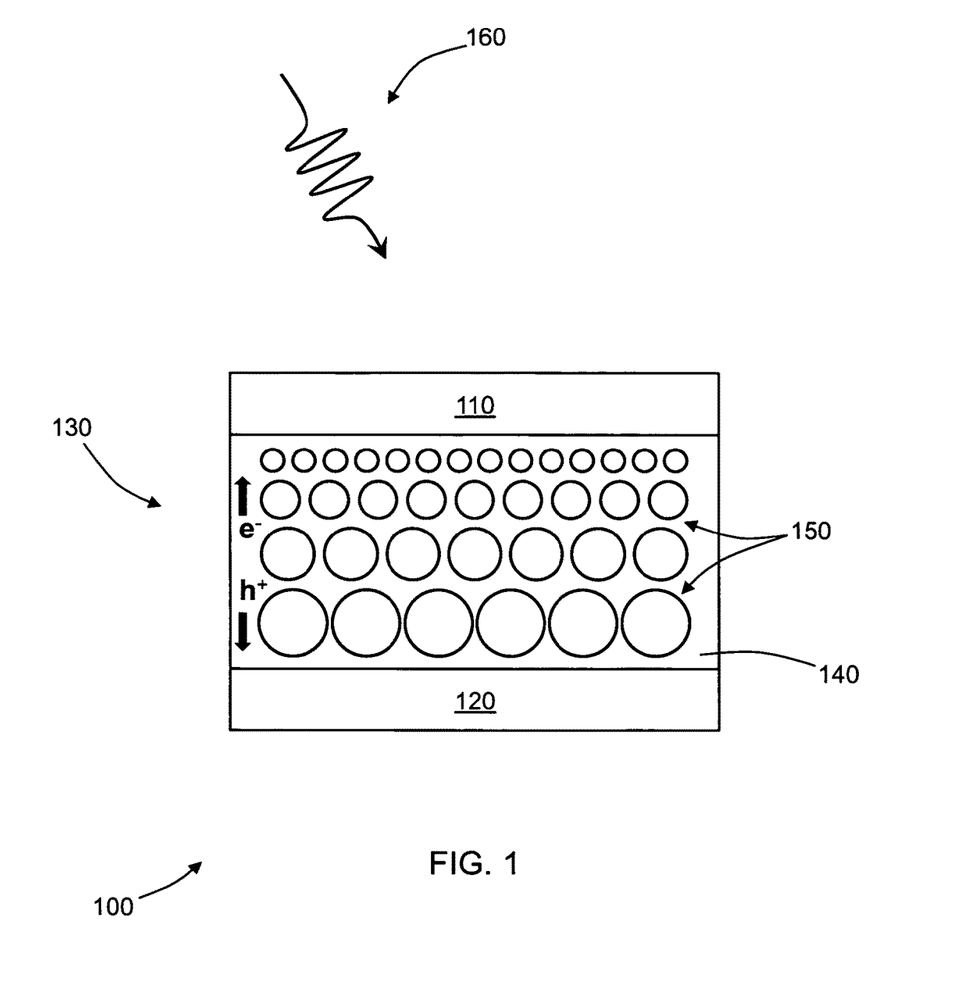
FIG. 1 shows an example of a quantum dot solar cell comprising an active layer with a quantum dot size gradient according to the present invention.

The present invention is directed to QDSCs that take advantage of at least the above properties relating to bandgaps and Fermi levels of quantum dots. FIG. 1 shows an example of a preferred embodiment of a QDSC 100. The QDSC 100 includes a first conductor layer 110, a second conductor layer 120, and an active layer 130. The first 110 and second 120 conductor layers can be any material suitable for conducting charges (e.g. electrons, holes, or any other charge carriers). In operation, a photon 160 is absorbed in the active layer 130 and dissociates at least one exciton, thereby creating pairs of charge carriers. The charge carriers are transported to the first 110 and second 120 conductor layers. In an embodiment, the first conductor layer 110 is optically transparent to allow the photon 160 to pass through it and be absorbed in the active layer 130. Additionally, the second conductor layer 120 can be optically reflective to increase the probability that the photon 160 will interact with the active layer 130.

The active layer 130 includes a plurality of quantum dots 150 and a matrix material 140 for hosting the quantum dots 150. It is important to note that the quantum dots 150 are preferably positioned in the active layer 130 to form a bandgap gradient between the conductor layers 110-120. In other words, quantum dots 150 having larger bandgaps are positioned closer to one of the conductor layers, e.g. the first conductor layer 110, than quantum dots 150 having smaller bandgaps. In an embodiment, quantum dots 150 having larger bandgaps are positioned more closely to the region of the QDSC where the incoming photon 160 is absorbed, however, alternative directions of the bandgap gradient can also be used.

In the embodiment shown in FIG. 1, the bandgap gradient is created by a size gradient of the quantum dots 150. In other words, smaller quantum dots 150 are positioned closer to the first conductor layer 110 than larger quantum dots 150. The quantum dots 150 of the present invention preferably range in size between about 0.5 nm to about 50 nm. As discussed above, by tuning the size of a quantum dot, a desired bandgap can be achieved and placed accordingly in the matrix material 140 of the active layer 130.

Figure 2A:
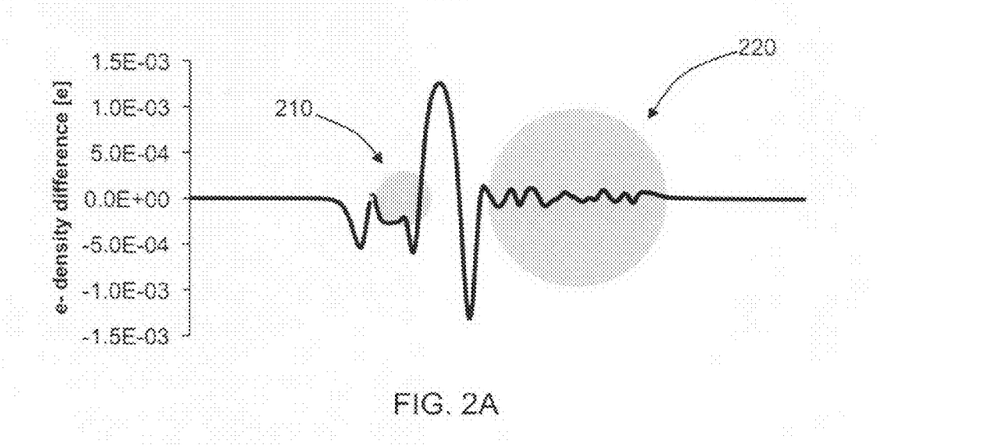
FIGS. 2A-C show plots of electron density, electric field, and voltage, respectively, versus position near two quantum dots of differing sizes an according to the present invention.
Figure 2B:
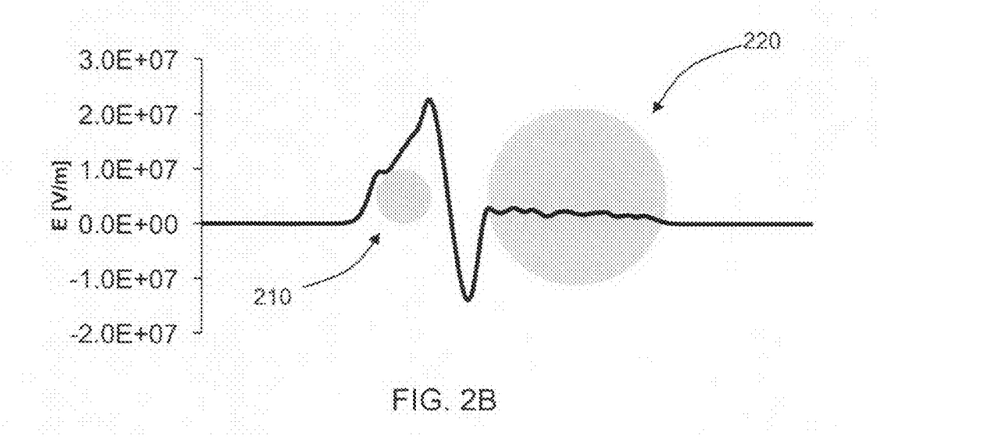
Figure 2C:
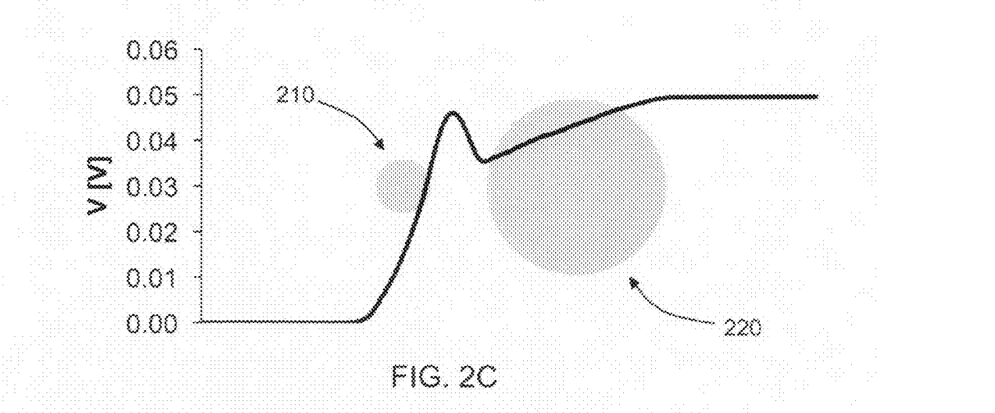
Figure 3:
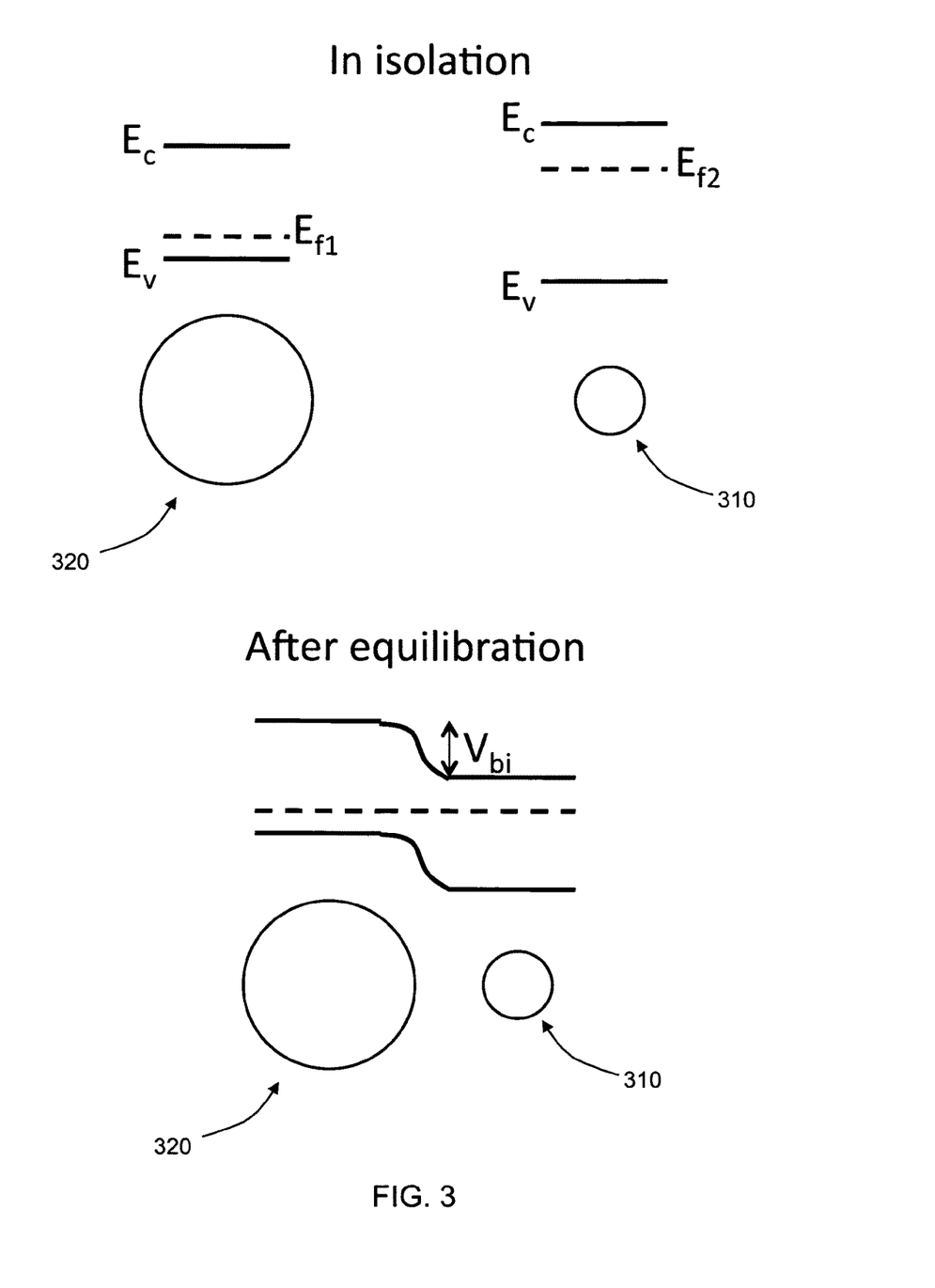
FIG. 3 shows a diagram of built-in voltage formation due to mismatching Fermi levels of nearby quantum dots according to the present invention.

FIGS. 2-3 show plots and diagrams that display advantageous properties of having proximate quantum dots of different sizes and/or Fermi levels. FIGS. 2A-C show plots of the electron density difference, the electric field, and the voltage, respectively, versus position near a small quantum dot 210 and a neighboring large quantum dot 220. As can be seen in these plots, an electron density difference between the two quantum dots 210-220 leads to a built-in field and voltage. In particular, FIG. 2C shows a built-in voltage formed in the region between the large quantum dot 220 and the small quantum dot 210. In an embodiment, the voltage drops from the region near the large quantum dot 220 to the region closer to the small quantum dot 210.

FIG. 3 shows a diagram of how a built-in voltage $V_{bi}$ can form between proximate quantum dots having different sizes. The top diagram in FIG. 3 shows a large quantum dot 320 and a smaller quantum dot 310 spaced apart such that they are essentially isolated. The top diagram also shows an example energy band diagram of the two quantum dots 310-320, including the conduction band energy $E_c$ and the valence band energy $E_v$. The conduction band is also referred to as the lowest unoccupied molecular orbital (LUMO) and the valence band is also referred to as the highest occupied molecular orbital (HOMO). The difference in the conduction band and the valence band is the bandgap. It is noted that the smaller quantum dot 310 has a larger bandgap than the larger quantum dot 320. The diagram shows that in isolation the Fermi level $E_{f1}$ of the large quantum dot 320 is less than the Fermi level $E_{f2}$ of the smaller quantum dot 310. The bottom diagram of FIG. 3 shows how placing the quantum dots 310-320 in close proximity causes the system to equilibrate, thereby creating a built-in voltage $V_{bi}$. More particularly, the process of equilibration includes equalizing the Fermi levels $E_{f1}$, $E_{f2}$ by altering the band structure, which causes the built-in voltage $V_{bi}$ to form.

The built-in voltage $V_{bi}$ allows for many desirable properties for the operation of a QDSC. For example, the built-in voltage $V_{bi}$ helps prevent exciton recombination, whereby the charge carriers generated from a dissociated exciton are not transported to the conductor layers, but instead recombine due to their mutual Coulombic attraction. Having a built-in voltage $V_{bi}$ reduces the Coulombic attraction between the two charge carriers as the field generated from the built-in voltage $V_{bi}$ directs a positively-charged carrier one direction and the negatively-charged carrier the opposite direction. In addition, built-in voltage $V_{bi}$ also helps to dissociate the excitons into free electrons and free holes.

In addition to its contribution toward deterring exciton recombination, the built-in voltage also aids in charge transport. By arranging the quantum dots such that a gradient in Fermi levels is present, the built-in voltage of the quantum dots can help direct the charge carriers to the appropriate conductor layers. For example, in FIG. 1, the smaller quantum dots 150 have higher Fermi levels than the larger quantum dots 150, therefore a built-in voltage will form in the active layer 130, which drives electrons toward the first conductor layer 110 and the oppositely-charged holes toward the second conductor layer 120. It is noted that the built-in voltage does not require additional energy costs as the field is generated by the system itself without external input.

Charge transport is an important consideration for efficiency of QDSCs. It is noted that in embodiments of the present invention, the charge carriers can be transported through a variety of physical mechanisms, including charge conduction and through quantum tunneling. In a preferred embodiment, the spacing between quantum dots in the active layer is sufficiently small to allow the charges to tunnel between adjacent quantum dots. In certain embodiments, the distance between adjacent quantum dots ranges from about 0.5 nm to about 10 nm.

QDSCs having quantum dots with small spacing and bandgap gradients formed by precise positioning of the quantum dots can be difficult to fabricate using conventional solar cell fabrication techniques. In a preferred embodiment, the quantum dots are positioned using atomic layer deposition (ALD), which enables extremely precise deposition of quantum dots in the host matrix material. When area-selective ALD is performed by selectively removing regions of a blocking layer, features may be placed with resolution only limited by the lithographic technique used to pattern the blocking layer. With conventional lithography, the resolution is on the ~100 nm scale, with electron-beam lithography the resolution approaches 20 nm, and with lithography performed by the tip of an atomic force microscope, the resolution is in the single nm regime. In an alternative technique, which may be more cost effective in fabrication but yield less ordered films, ALD may be used to self-assemble quantum dots, where nucleation and growth of the quantum dots is a random process. It is noted that the present invention is not limited to QDSCs fabricated by ALD; other fabrication techniques can also be employed. In particular, other deposition techniques, such as layer-by-layer assembly and Langmuir-Blodgett deposition can also be used. In another embodiment, the QDSCs are fabricated by spin-coating or drop-casting.

Figure 4:
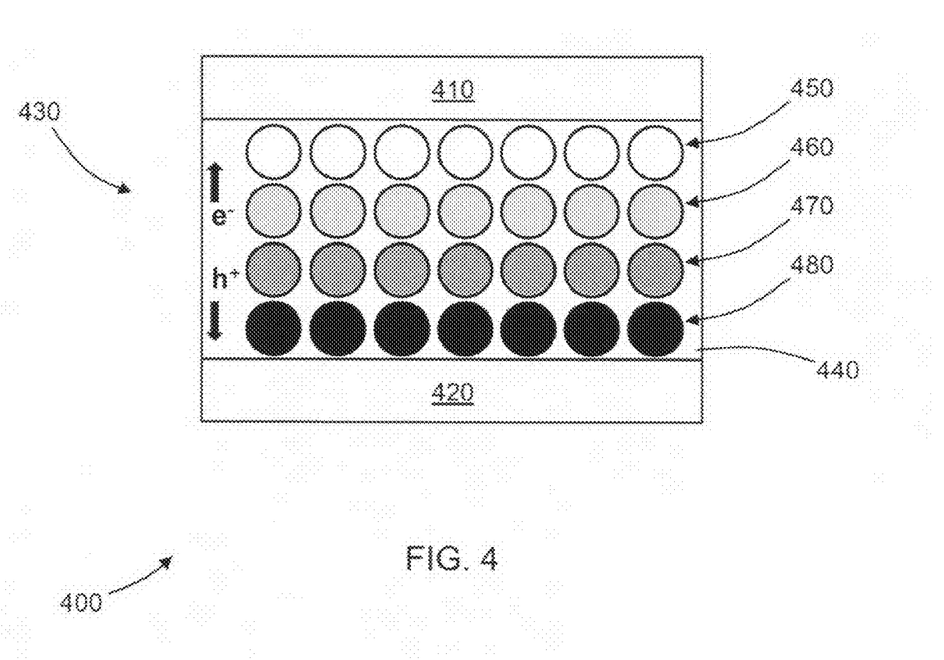
FIG. 4 shows an example of a quantum dot solar cell having a bandgap gradient due to different quantum dot compositions according to the present invention.

Though FIG. 1 shows a QDSC 100 having a size gradient of quantum dots 150 to form a bandgap gradient, the present invention is also directed to other physical properties, such as composition and shape, to establish a bandgap gradient. FIG. 4 shows a QDSC 400 with a first conductor layer 410, a second conductor layer 420, an active layer 430, a matrix material 440 in the active layer 430, and multiple layers of quantum dots 450-480 of different composition deposited in the matrix material 440. The various layers of quantum dots 450-480 are deposited such that a bandgap gradient exists between the first 410 and the second 420 conductor layers. For example, the quantum dots in layer 450 have a larger bandgap than the quantum dots in layer 460, the quantum dots in layer 460 have a larger bandgap than the quantum dots in layer 470, and so on. Thereby, a bandgap gradient is formed by compositional differences in the quantum dots of the QDSC 400.

It is noted that the quantum dots can have the same or different sizes and the bandgap gradient can be created by differences in quantum dot size, composition, shape, or any combination thereof. In a preferred embodiment, the quantum dot composition is selected from the group consisting of PbS, PbSe, PbTe, CdS, CdSe, CdTe, HgTe, HgS, HgSe, ZnS, ZnSe, InAs, InP, GaAs, GaP, AlP, AlAs, Si, and Ge. More generally, the quantum dots can comprise metallic quantum dots, semiconducting quantum dots, or any combination thereof. Quantum dots can conduct or allow tunneling for positive charges, negative charges, or both. In an embodiment, the quantum dot shape is selected from the group consisting of rods, spheres, disks, squares, triangles, pyramids, tetrapods, or any other shape.

Figure 5:
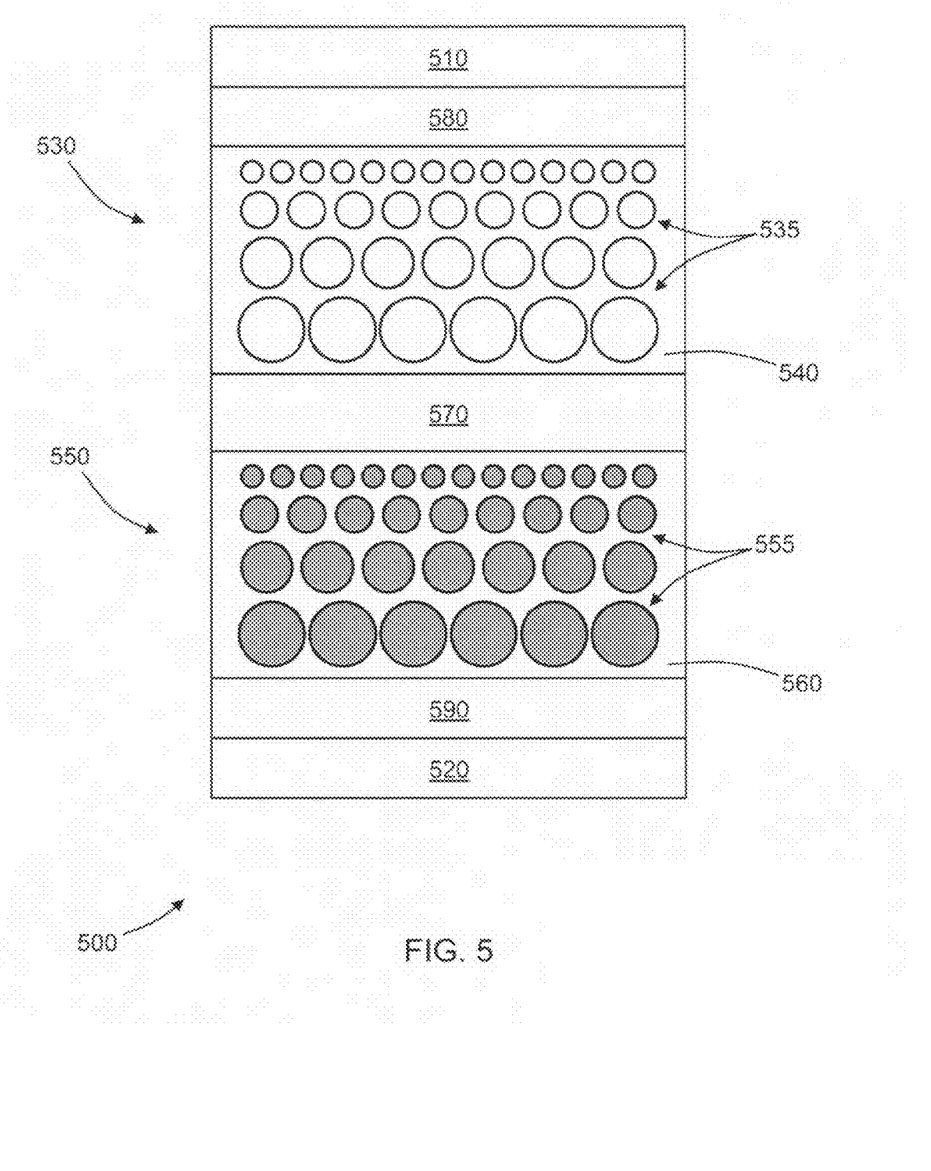
FIG. 5 shows an example of a quantum dot solar cell comprising multiple active layers and a bandgap gradient formed a gradient in quantum dot size and composition according to the present invention.

FIG. 5 shows another embodiment of a QDSC 500 of the present invention. The QDSC 500 includes a first conductor layer 510, a second conductor layer 520, and multiple active layers 530 and 550. Each of the active layers 530 and 550 comprises a matrix material 540 and 560, respectively, and quantum dots 535 and 555, respectively. Though the QDSC 500 shown in FIG. 5 only has two active layers 530 and 550, it is noted that embodiments of the present invention can have any number of active layers.

In a preferred embodiment, the position of the quantum dots in each of the active layers is based on the bandgaps of the quantum dots, wherein a bandgap gradient is present in each of the active layers. It is noted that the bandgap gradient can be formed due to a size gradient, compositional differences as in the active layer 430 of FIG. 4, or any other physical differences in the quantum dots. Preferably, the position of each of the active layers is based on the bandgaps of its quantum dots, wherein the active layers having quantum dots with larger bandgaps are closer to one of the conductor layers than the active layers having quantum dots with smaller bandgaps. For example, in FIG. 5, quantum dots 535 of active layer 530 have larger bandgaps than quantum dots 555 of active layer 550, therefore active layer 530 is positioned closer to the first conductor layer 510 than active layer 550.

In the embodiment shown in FIG. 5, both active layers 530 and 550 have quantum dot size gradients within the active layer. However the quantum dots in active layer 550 are of a different composition than the quantum dots in active layer 530, and a monotonic bandgap gradient exists between the first conductor layer 510 and the second conductor layer 520 due to the quantum dot size gradient within each active layer 530 and 550 and the composition differences between the active layers 530 and 550. As would be appreciated by one of ordinary skill in the art, other configurations using quantum dot size, composition, shape, or any combination thereof can be possible to establish a bandgap gradient between the conductor layers 510 and 520.

In addition to having quantum dots of different compositions between the active layers 530 and 550, it is noted that the matrix materials 540 and 560 can be different or the same. For example, matrix material 540 can have a different dielectric constant as matrix material 560. In an embodiment, materials having certain dielectric constants are chosen based on charge-screening and charge transport properties. The matrix materials may also have different bandgaps. The bandgaps would be chosen based on tunneling or carrier transport considerations balanced by the desirability of absorbing light in the matrix materials as opposed to in the quantum dots. Generally, a higher bandgap gives larger tunneling resistance but also provides a more effective confinement potential for the quantum dots.

The matrix material in the active layer can be an insulating material, a semiconducting material, or any combination thereof. In an embodiment, the matrix material conducts one type of charge carrier while the quantum dots conduct a different type of charge carrier. For example, the matrix material conducts holes while the quantum dots deposited in it conduct electrons. In other embodiments, the matrix material conducts both charge carriers or does not significantly conduct any charge.

In an embodiment of the present invention, a QDSC also includes a tunnel junction layer located between the first and the second conductor layers. In an embodiment, the tunnel junction includes two adjacent semiconducting layers that have opposite doping (heavily n-doped versus heavily p-doped). Band bending in the regime of the tunnel junction is sufficiently steep to allow electrons in the conduction band of the n+ layer to tunnel through the bandgap and combine with a hole in the p+ layer. If a tunnel junction is included, current matching should be enforced on each light absorbing layer of the solar cell. Since a tunnel junction effectively places two solar cells in series, the current through each cell must be continuous. This would place constraints on the thicknesses and optical densities of each layer. The advantage of a tunnel junction is that by placing the solar cells in series, the voltage of each light active layer effectively adds. The top layer delivers the highest voltage, based on the bandgap of QDs in that layer, while lower layers add a voltage based on their bandgaps. Therefore, as in a triple junction solar cell, the Shockley-Queisser efficiency limit does not apply, and efficiencies substantially in excess of 40% may be reasonably achieved. For certain embodiments having multiple active layers, a tunnel junction layer is located between two adjacent active layers. For example, FIG. 5 shows an exemplary embodiment of a QDSC 500 with two active layers 530 and 550, and a tunnel junction layer 570 situated between active layers 530 and 550.

FIG. 5 also shows two optional layers to embodiments of the present invention, an n+ layer 580 and a p+ layer 590. The n+ 580 and p+ 590 layers provide an electric field across the active layer or layers in the QDSC for preventing exciton recombination and helping charge transport to the conductor layers 510 and 520. The n+ 580 and p+ 590 layers are positioned adjacent to the first 510 and second 520 conductor layers, respectively. In addition to providing an electric field across the active layer or layers, the n+ 580 and p+ 590 layers also act as barrier layers against certain types of charge carriers. For example, if the intended purpose of the first conductor layer 510 is to collect electrons, the n+ 580 layer provides a barrier to prevent holes from being transported into the first conductor layer 510. Either or both of the n+ 580 and p+ 590 layers can act as barriers for electrons or holes.

In an embodiment, the n+ 580 and p+ 590 layers include a doped semiconductor material. Preferably, the n+ layer has a high Fermi level and the p+ layer has a low Fermi level. In an exemplary embodiment, the p+ layer is comprised of B-doped Si and the n+ layer is comprised of P (phosphorus)-doped Si.

Figure 6A:
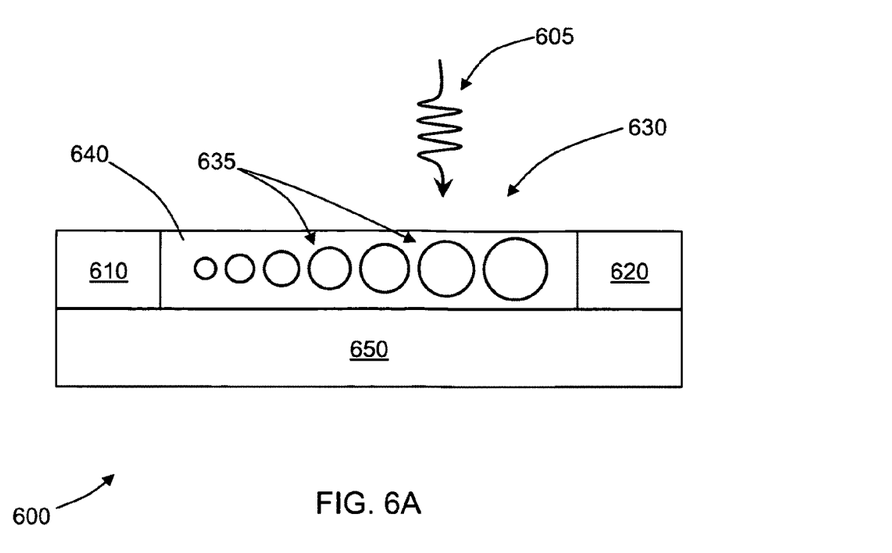
FIG. 6A shows an example of a quantum dot solar cell comprising electrodes on the sides of the active layer according to the present invention.
Figure 6B:
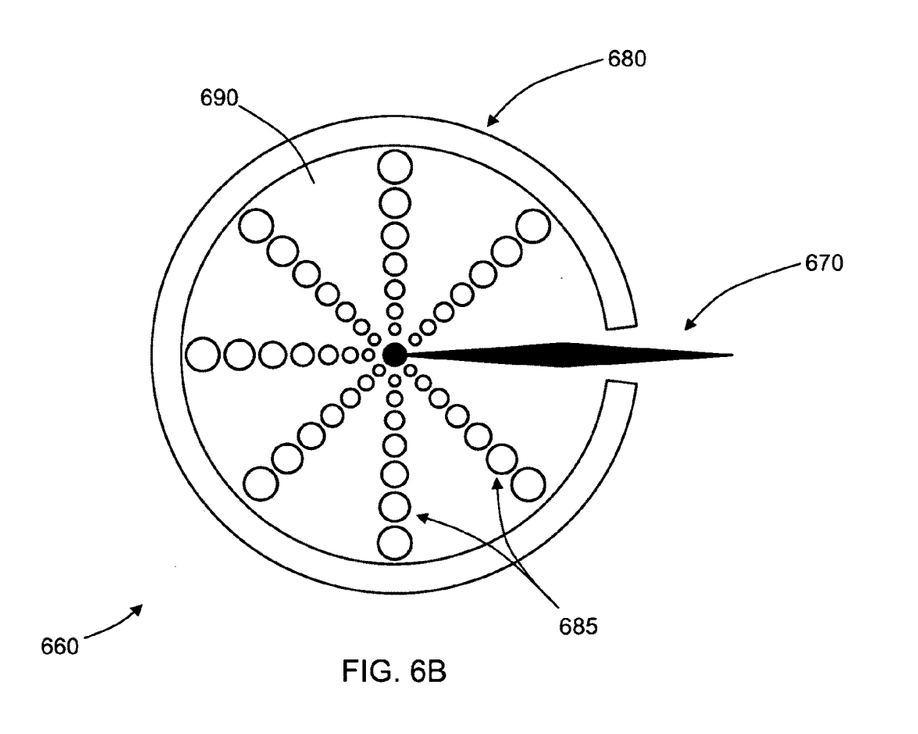
FIG. 6B shows an example of a quantum dot solar cell having a hub-and-spoke configuration according to the present invention.

FIGS. 6A-B show further embodiments of the present invention having different geometric configurations than the QDSCs of FIGS. 1, 4, and 5. The QDSC 600 shown in FIG. 6A includes a first conductor layer 610, a second conductor layer 620, an active layer 630 with a matrix material 640 and a plurality of quantum dots 635, and a metal reflector 650. Similar to QDSC 100 shown in FIG. 1, QDSC 600 has a bandgap gradient between the first conductor layer 610 and the second conductor layer 620. However, the bandgap gradient of QDSC 600 is oriented in a different direction than the bandgap gradient of QDSC 100 with respect to the direction of incoming photons 605.

FIG. 6B shows an alternative embodiment of a QDSC 660 with a hub-and-spoke configuration. QDSC 660 includes a first conductor 670, a second conductor 680, and an active layer comprising a plurality of quantum dots 685 and a matrix material 690. The second conductor 680 can be circularly shaped and a radial bandgap gradient is present. It is noted that the present invention is not limited to the configurations described in the figures and one of ordinary skill in the art would appreciate other geometric configurations that do not depart from the principles of the present invention.

Figure 7A:
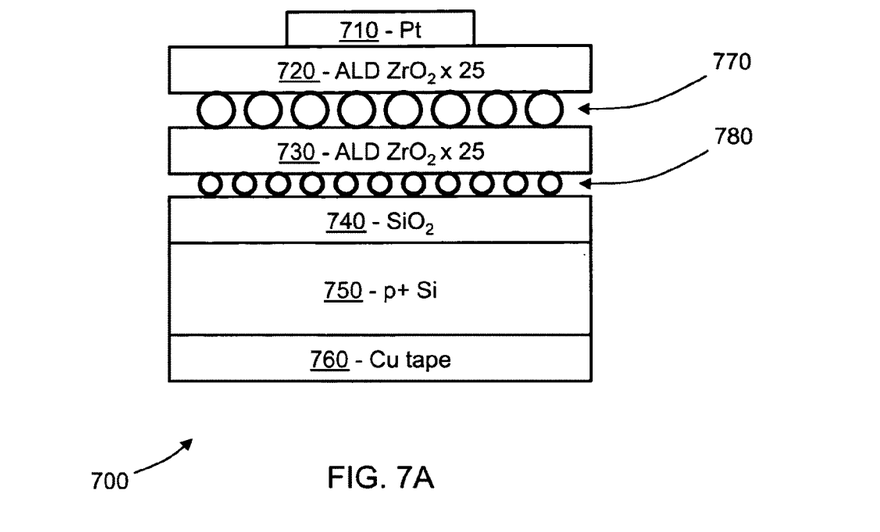
FIG. 7A shows an example of a quantum dot solar cell according to the present invention.
Figure 7B:
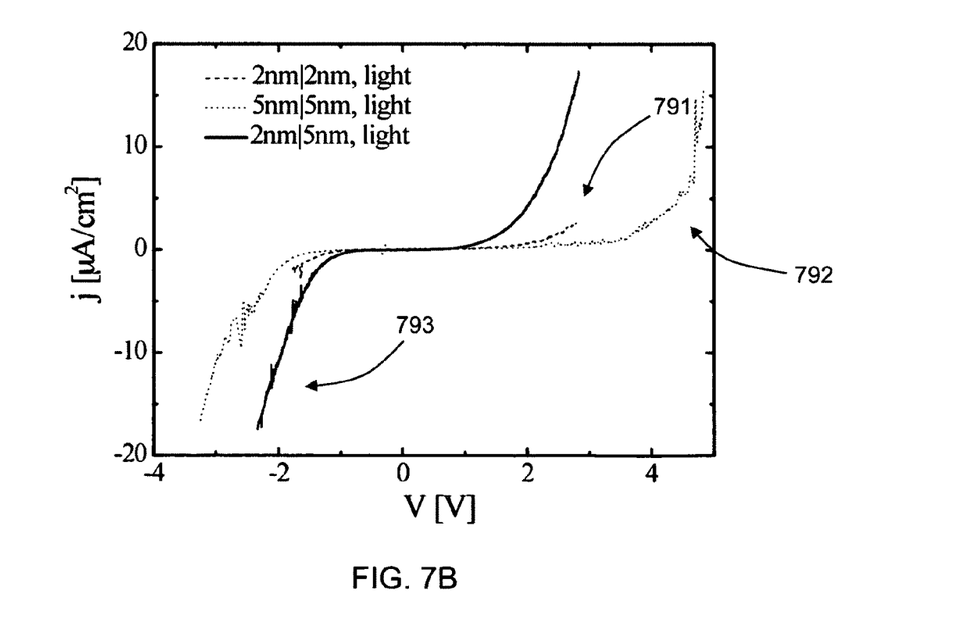
FIG. 7B shows a plot of current versus voltage for the quantum dot solar cell of FIG. 7A.

FIG. 7A shows an example QDSC 700 that has been fabricated for experimental purposes. QDSC 700 includes a Pt conductor layer 710, a $ZrO_2$ matrix material 720, a first layer of PbS quantum dots 770, another $ZrO_2$ matrix material 730, a second layer of PbS quantum dots 780, a $SiO_2$ layer 740, a p+ Si layer 750, and a Cu conductor layer. Current versus voltage measurements were performed for the QDSC 700 with different sizes of quantum dots in layers 770 and 780. FIG. 7B shows a plot of current density versus voltage for three different devices. Plot 791 shows current versus voltage measurements when quantum dots in both layers 770 and 780 are 2 nm in diameter. Plot 792 shows current versus voltage measurements when quantum dots in both layers 770 and 780 are 5 nm in diameter. As shown by these plots 791-792, neither of these devices demonstrates high performance. Plot 793 shows current versus voltage measurements when quantum dots in layer 770 are 5 nm in diameter and quantum dots in layer 780 are 2 nm in diameter. In other words, the measurements shown in plot 793 are of a device having a bandgap gradient resulting from the size gradient with improved performance over devices without any bandgap gradients.

As one of ordinary skill in the art will appreciate, various changes, substitutions, and alterations could be made or otherwise implemented without departing from the principles of the present invention, e.g. other materials not listed herein can be used for the various layers and quantum dots. Accordingly, the scope of the invention should be determined by the following claims and their legal equivalents.

What is claimed is:
1. A photovoltaic device comprising:
   (a) a first conductor layer;
   (b) a second conductor layer;
   (c) an active layer, wherein said active layer is situated between said first and said second conductor layers, wherein said active layer comprises a matrix material and a plurality of quantum dots deposited in said matrix material, wherein each of said quantum dots has a bandgap, wherein the position of each of said quantum dots in said active layer is based on the size of its bandgap, wherein said quantum dots with larger bandgaps are positioned closer to said first conductor layer than said quantum dots with smaller bandgaps, whereby a bandgap gradient is present in said active layer;

wherein the matrix material comprises an insulator;

wherein adjacent quantum dots are separated by distances in a direction of the bandgap gradient that allow charge tunneling between the adjacent quantum dots; and wherein adjacent quantum dots are also separated from each other in directions perpendicular to the direction of the bandgap gradient.

2. The device as set forth in claim 1, wherein a size gradient of said quantum dots is present in said active layer, and wherein said bandgap gradient is created by said size gradient of said quantum dots.

3. The device as set forth in claim 1, wherein at least some of said quantum dots have different compositions, and wherein said bandgap gradient is created by said different compositions of at least some of said quantum dots.

4. The device as set forth in claim 1, wherein each of said quantum dots has a Fermi level, wherein at least two adjacent quantum dots have different Fermi levels, and wherein the difference in said Fermi levels of said adjacent quantum dots creates a built-in electric field.

5. The device as set forth in claim 4, wherein said quantum dots with higher Fermi levels are positioned closer to said first conductor layer than said quantum dots with lower Fermi levels.

6. The device as set forth in claim 1, further comprising a tunnel junction layer, wherein said tunnel junction layer is situated between said first and said second conductor layers.

7. The device as set forth in claim 1, further comprising an n+ layer and a p+ layer, wherein said n+ layer is situated between said first conductor layer and said active layer, wherein said p+ layer is situated between said second conductor layer and said active layer, and wherein said n+ and said p+ layers create an electric field in said active layer.

8. The device as set forth in claim 1, wherein at least one of said conductor layers is optically transparent.

9. The device as set forth in claim 1, wherein at least one of said conductor layers is optically reflective.

10. The device as set forth in claim 1, wherein said quantum dots are deposited by atomic layer deposition, layer-by-layer assembly, Langmuir-Blodgett deposition or a combination thereof.

11. The device as set forth in claim 1, wherein the distance between adjacent quantum dots ranges from about 0.5 nm to about 10 nm.

12. The device as set forth in claim 1, wherein each of said plurality of quantum dots range in size from about 0.5 nm to about 50 nm.

13. The device as set forth in claim 1, wherein said plurality of quantum dots have one or more shapes, and wherein said shapes of said quantum dots are selected from the group consisting of rods, spheres, disks, pyramids, triangles, squares, plates, and tetrapods.

14. The device as set forth in claim 1, wherein said quantum dots comprise metallic quantum dots, semiconducting quantum dots, or a combination thereof.

15. The device of claim 1, wherein the bandgap gradient provides a built-in voltage.

16. A photovoltaic device comprising:
(a) a first conductor layer;
(b) a second conductor layer;
(c) a plurality of active layers, wherein said active layers are situated between said first and said second conductor layers, wherein each of said active layers comprises a matrix material and a plurality of quantum dots deposited in said matrix material, wherein each of said quantum dots has a bandgap, wherein for each of said active layers the position of said quantum dots is based on the size of its bandgap, and wherein a bandgap gradient is present in each of said active layers;

wherein the matrix material comprises an insulator;

wherein adjacent quantum dots are separated by distances in a direction of the bandgap gradient that allow charge tunneling between the adjacent quantum dots; and wherein adjacent quantum dots are also separated from each other in directions perpendicular to the direction of the bandgap gradient.

17. The device as set forth in claim 16, further comprising one or more tunnel junction layers, wherein each of said tunnel junction layers is situated between two of said active layers.

18. The device as set forth in claim 16, wherein said matrix materials of at least two of said active layers have different dielectric constants.

19. The device as set forth in claim 16, wherein the position of each of said active layers is based on the bandgaps of said quantum dots in the same of said active layers, and wherein said active layers having said quantum dots with larger bandgaps are closer to said first conductor layer than said active layers having said quantum dots with smaller bandgaps.

20. The device of claim 16, wherein the bandgap gradient provides a built-in voltage.

* * * * *